United States Patent
Cometti

(10) Patent No.: US 9,761,308 B1
(45) Date of Patent: Sep. 12, 2017

(54) SYSTEMS AND METHODS FOR ADAPTIVE READ LEVEL ADJUSTMENT

(71) Applicant: HGST Netherlands B.V., Amsterdam (NL)

(72) Inventor: Aldo G. Cometti, San Diego, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 15/068,427

(22) Filed: Mar. 11, 2016

(51) Int. Cl.
- *G06F 11/00* (2006.01)
- *G11C 11/56* (2006.01)
- *G11C 16/26* (2006.01)
- *G06F 11/07* (2006.01)

(52) U.S. Cl.
CPC ........ *G11C 11/5642* (2013.01); *G06F 11/076* (2013.01); *G06F 11/079* (2013.01); *G06F 11/0727* (2013.01); *G06F 11/0793* (2013.01); *G11C 16/26* (2013.01)

(58) Field of Classification Search
USPC .................................................. 714/25, 37
See application file for complete search history.

(56) References Cited

U.S. PATENT DOCUMENTS

| | | | |
|---|---|---|---|
| 2009/0080259 A1* | 3/2009 | Alrod | G11C 11/5642 365/185.18 |
| 2015/0149840 A1* | 5/2015 | Alhussien | H03M 13/1125 714/719 |
| 2015/0214497 A1* | 7/2015 | Park | H01L 51/0591 257/4 |

* cited by examiner

*Primary Examiner* — Sarai Butler
(74) *Attorney, Agent, or Firm* — McDermott Will & Emery LLP

(57) ABSTRACT

Reading requested data from flash memory using a first read level voltage. A number of first bit-value errors and a number of second bit-value errors is determined from the read requested data. An error ratio of the number of first bit-value errors and the number of second bit-value errors is compared to an error-ratio range. The first level voltage is adjusted based on the comparison of the error ratio to the error-ratio range.

20 Claims, 8 Drawing Sheets

SYSTEMS AND METHODS FOR ADAPTIVE READ LEVEL ADJUSTMENT

BACKGROUND

The present disclosure relates to solid-state memory, such as flash memory, and in particular to adjusting read levels used to read data stored in solid-state memory. As flash memory ages or data retention times increase, the program level distributions of the flash memory cells tend to spread and shift resulting in increased read error rates. Adjusting read levels as flash memory ages or as data retention times increase can reduce the read error rates. However, many read level adjustment algorithms are not efficient at determining when to make adjustments or how the adjustments are made.

SUMMARY

The subject technology relates to a method for managing a data storage system, including reading requested data from flash memory using a first read level voltage, determining a number of first bit-value errors and a number of second bit-value errors in the read requested data, and comparing an error ratio of the number of first bit-value errors and the number of second bit-value errors to an error-ratio range. In certain aspects, the data storage system may further include adjusting the first read level voltage based on the comparison of the error ratio to the error-ratio range.

In certain aspects, the subject technology relates to a data storage system, including a flash memory, a controller configured to execute a method for controlling the data system. The controller may be further configured to perform operations for reading and decoding a plurality of code words of requested data from a block in the flash memory using a first read level voltage, determining a number of first bit-value errors and a number of second bit-value errors in the read requested data after a target number of code words have been read and decoded, comparing an error ratio of the number of first bit-value errors and the number of second bit-value errors to an error-ratio range, and adjusting the first read level voltage based on the comparison of the error ratio to the error-ratio range.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

DETAILED DESCRIPTION

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent that the present disclosure may be practiced without these specific details. In some instances, structures and components are shown in block diagram form in order to avoid obscuring the concepts of the present disclosure Like components are labeled with identical element numbers for ease of understanding.

Flash memory is read using read level voltages. When the read level voltages are set at optimal levels, the bit error rate (BER) may be minimized. However, as flash memory devices age or data retention times in the flash memory devices increase, the optimal read level voltages shift. As will be described in detail below, the subject technology provides systems and methods for adaptive read level voltage adjustments. The subject technology efficiently determines when to adjust read level voltages and can perform adjustments using metrics obtained during standard read operations. The subject technology further efficiently determines when to perform calibration operations that may require additional read operations. Both the adjustment and the calibration operations allow the system to adjust the read level voltages to account for the aging of the flash memory devices while minimizing the number of extra operations that are performed to make the adjustments or calibrations.

Figure 1:
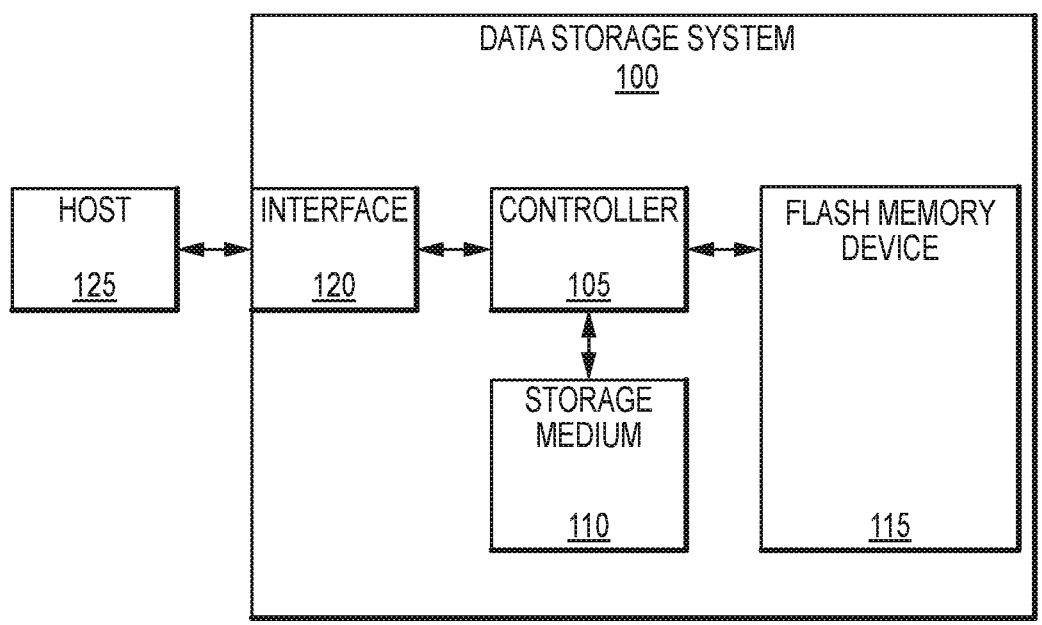
FIG. 1 is a block diagram depicting components of a data storage system according to aspects of the subject technology.

FIG. 1 is a block diagram depicting components of an example data storage system 100 according to various implementations of the subject technology. Data storage system 100 may include a controller 105, storage medium 110, flash memory device 115, and interface 120. Controller 105 may use storage medium 110 for temporary storage of data and information used to manage data storage system 100. Controller 105 may include several internal components (not shown) such as one or more processors, read-only memory (ROM), a flash component interface (for example, a multiplexer to manage instruction and data transport along a connection to flash memory device 115), an I/O interface, error correction code (ECC) module, and the like. The ECC module may be configured to generate code words to be stored in the flash memory device 115 from data received from host 125 and to decode code words read from flash memory device 115 before sending the decoded data to the host 125. Various ECC solutions may be used to encode and decode data to generate the code words. In some aspects, one or more elements of controller 105 may be integrated into a single chip. In other aspects, the elements may be implemented on multiple discrete components.

Controller 105, using one or more processors for example, may be configured to execute code or instructions to perform the operations and functionality described herein, manage request flow and address mappings, and to perform calculations and generate commands. The one or more processors of controller 105 may be configured to monitor and control the operation of the components in the controller 105 and data storage system 100. The one or more processors may include a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 105. One or more sequences of instructions may be stored and read from storage medium 110, flash memory device 115, or received from host device 125 (for example, via a host interface 120). ROM, storage medium 110, flash memory device 115, represent examples of machine or computer readable media on which instructions/code executable by controller 105 may be stored. Machine or computer readable media may generally refer to any tangible and/or non-transitory media used to provide instructions to controller 105 and/or its processor, including both volatile media, such as dynamic memory used for storage medium 110 or for buffers within controller 105, and non-volatile media, such as electronic media, optical media, and magnetic media.

The data storage system 100 may further include a host interface 120. Host interface 120 may be configured to be coupled to host device 125, to receive data from and send data to host device 125. Host interface 120 may include both electrical and physical connections for operably coupling host device 125 to controller 105. Host interface 120 may be configured to communicate data, addresses, and control signals between host device 125 and controller 105. In this manner, controller 105 is configured to store data received from host device 125 in flash memory device 115 in response to a write command from host device 125, and to read data stored in flash memory device 115 and to transfer the read data to host device 125 via host interface 120 in response to a read command from host device 125. Interface 120 may use any proprietary or standard interface protocols including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

According to aspects of the subject technology, host interface 120 may implement a wireless connection between host device 125 and data storage system 100 using standardized or proprietary wireless interface standards and protocols. In this regard, host interface 120 or other components of data storage system 100 may include a wireless transceiver to place host device 125 and data storage system 100 in wireless communication with each other.

Host device 125 represents any device configured to be coupled to data storage system 100 and to store data in data storage system 100. Host device 125 may be a computing system such as a personal computer, a server, a workstation, a laptop computer, PDA, smart phone, and the like. Alternatively, host device 125 may be an electronic device such as a digital camera, a digital audio player, a digital video recorder, and the like. Host device 125 may use logical addressing for data commands sent to data storage system 100. Data storage system 100 may then map logical addresses received from host device 125 to physical addresses of memory locations in flash memory device 115.

In some aspects, storage medium 110 represents volatile memory used to temporarily store data and information used to manage data storage system 100. According to aspects of the present disclosure, storage medium 110 is random access memory (RAM) such as double data rate (DDR) RAM. Other types of RAM also may be used to implement storage medium 110. Storage medium 110 may be implemented using a single RAM module or multiple RAM modules. While storage medium 110 is depicted as being distinct from controller 105, those skilled in the art will recognize that storage medium 110 may be incorporated into controller 105 without departing from the scope of the present disclosure. Alternatively, storage medium 110 may be a non-volatile memory such as a magnetic disk, flash memory, peripheral SSD, and the like.

Flash memory device 115 represents a non-volatile memory device for storing data. According to aspects of the present disclosure, flash memory device 115 includes, for example, a NAND flash memory. The NAND flash memory may be organized into pages and blocks. Each of the blocks in the NAND flash memory may include a number of pages, for example 256 and each of the pages may contain one or more sectors or portions of data. Flash memory device 115 may include a single flash memory device or chip, or may include multiple flash memory devices or chips arranged in multiple channels. Flash memory device 115 is not limited to any particular capacity or configuration. For example, the number of physical blocks, the number of physical pages per physical block, the number of sectors per physical page, and/or the size of the sectors may vary.

Flash memory device 115 may comprise single-level cell (SLC) memory, multilevel cell (MLC) memory and/or three-level cell (TLC) memory. In some aspects, flash memory device 115 may comprise one or more hybrid memory devices that can function in one or more of a SLC, MLC or TLC mode. The subject technology is not limited to these types of memory and may be applied to flash memory cells configured and operated using more than three levels (e.g., 4 bits per cell, 5 bits per cell, etc.).

An MLC NAND flash memory provides for more than one bit to be stored per cell by using multiple levels of electrical charge applied to the floating gates of its cells to achieve multiple state of conductivity, each occurring at different voltage threshold ($V_T$). The MLC NAND cell may be capable of storing one of four programming levels (levels of charge) per cell, yielding two logical bits of information per cell: the Most Significant Bit (MSB) and Least Significant Bit (LSB). These two bits from the cells may make up corresponding MSB and LSB pages, respectively.

Figure 2:
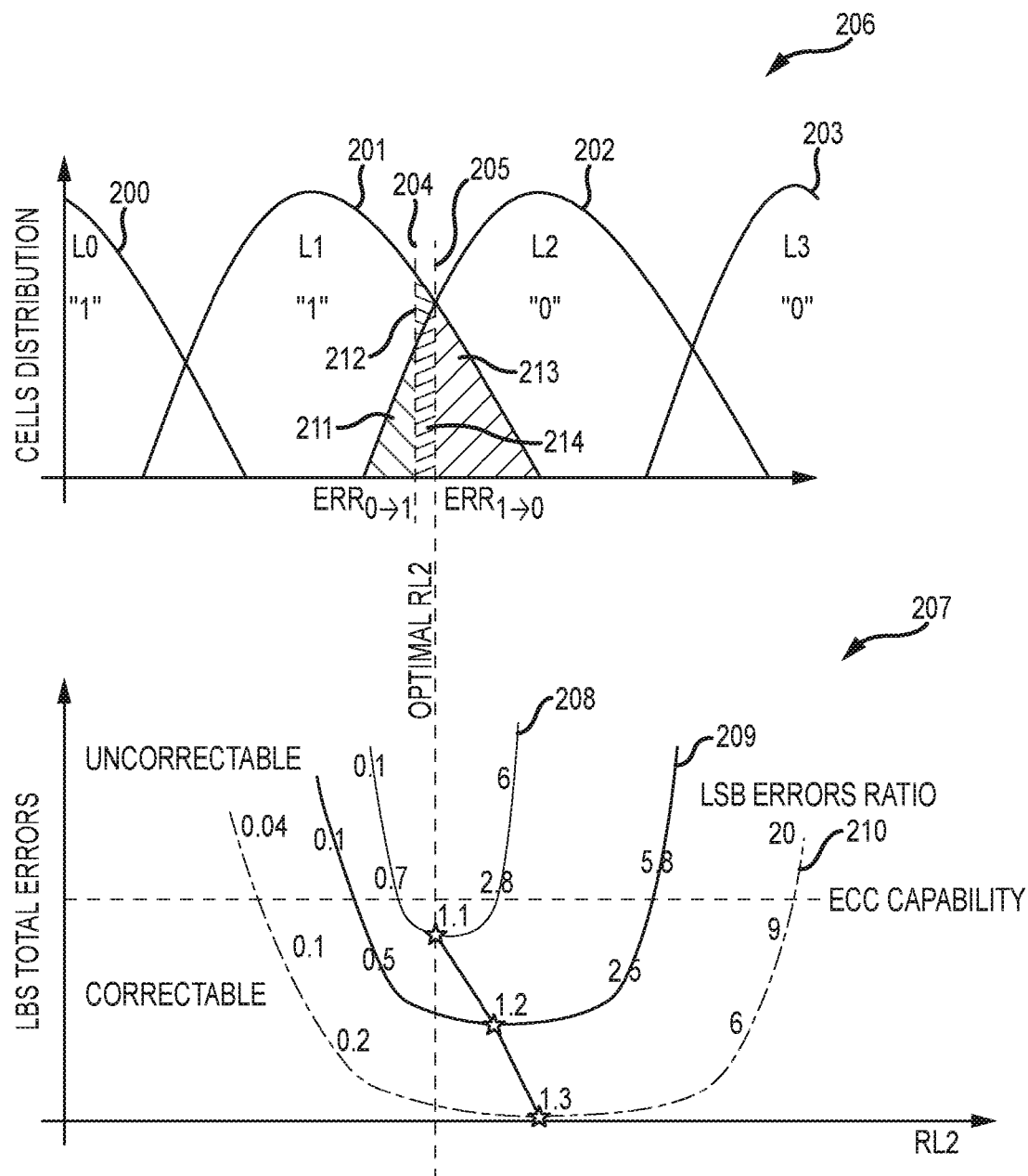
FIG. 2 includes an example graph of cell distributions among four program levels of an MLC flash memory and an example graph illustrating relationship among LSB read errors, varying read level voltages, and an LSB error ratio according to aspects of the subject technology.

FIG. 2 includes an example graph of cell distributions among four program levels of an MLC flash memory and an example graph illustrating relationship among LSB read errors, varying read level voltages for read level 2 (RL2), and an LSB error ratio described in more detail below. Graph 206 illustrates the distributions of flash memory cells among four program levels: L0, L1, L2 and L3. With four program levels, each flash memory cell can store two bits of data, an LSB and an MSB. The LSB value for each of the program levels is indicated on graph 206 according to one example. Specifically, L0 and L1 correspond to an LSB value of "1", with L2 and L3 corresponding to an LSB value of "0".

Read level 2 (RL2) may be used to read and distinguish flash memory cells programmed with an LSB value of "1" (L0 and L1) from flash memory cells programmed with an LSB value of "0" (L2 and L3). As depicted in graph 206, program level distributions may overlap, which results in read errors. The overlapping distributions may be due to the flash memory device aging (increasing program/erase (P/E) cycles) or increasing data retention times. With overlapping program level distributions, the read level voltages used for read operations have varying impacts on read errors.

Graph 206 illustrates two different read level voltages for RL2, RL2 204 and RL2 205. RL2 204 may be the initial setting for RL2 and RL2 205 may represent an optimal setting for RL2. The patterned areas of the distribution curves for L1 and L2 represent read or bit-value errors. For example, using RL2 204, area 211 represents flash memory cells that were programmed with an LSB value of "0" (e.g., L2) but mistakenly read as containing an LSB value of "1" (e.g., L1). This first type of read bit-value error is designated by $err_{0 \to 1}$. Similarly, areas 212, 213 and 214 represent flash memory cells that were programmed with an LSB value of "1" (e.g., L1) but mistakenly read as containing an LSB value of "0" (e.g., L2). This second type of read or bit-value error is designated by $err_{1 \to 0}$. Using RL2 205, area 212 no longer contains read errors and area 214 changes from representing the second type of read error to representing the first type of read error.

Example graph 207 depicts the relationship among the total LSB read errors and RL2. The total LSB read errors represents the sum of the number of the first and second types of read errors, $err_{0 \to 1}$ and $err_{1 \to 0}$. The three curves 208, 209 and 210 represent three different stages in the life of a flash memory device. Curve 208 may represent a later stage in the life of a flash memory device as measured by P/E cycle count or data retention time, curve 209 may represent a middle stage in the life of the flash memory device, and curve 210 may represent an early stage in the life of the flash memory device. Also indicated on graph 207 is a line representing a threshold value for a read error count that exceeds the capability of the ECC in the data storage system. The total number of read errors must remain below the threshold line in order for the data storage system to correct any read errors and return requested data to a host system using the ECC functionality. Curves 208, 209 and 210 are intended to illustrate the relative values at different life stages, with the actual values of P/E cycle count or retention time not being provided nor necessary for understanding the subject technology.

According to aspects of the subject technology, an optimal read level voltage may be determined to be the read level voltage that results in the least number of read errors, represented by the stars on curves 208, 209, and 210. As RL2 moves one direction or the other away from the optimal level, the total number of LSB read errors increases. Also shown in association with each of curves 208, 209, and 210 are LSB error ratios determined by dividing the first type of read error ($err_{0 \to 1}$) by the second type of read error ($err_{1 \to 0}$). While the range of error ratios shown on curves 208, 209, and 210 vary, the error ratio at the optimal value for RL2 remains within a relatively narrow range (e.g., 1.1 to 1.3) across the different life stages compared to the overall ranges (e.g., 0.04 to 20; 0.1 to 5.8; 0.1 to 6). As will be discussed below, the subject technology takes advantage of this relatively narrow range of the LSB error ratio to utilize the LSB error ratio as a signal for read level voltage adjustment.

Laboratory testing and simulations have shown that optimal values for RL1 and RL3, used to determine the MSB values stored in flash memory cells, correlate well with the optimal value for RL2. Accordingly, the subject technology determines adjustments for RL2 using the algorithms described herein and makes corresponding adjustments to RL1 and RL3. The adjustments to RL1 and RL3 may have the same value as the adjustments for RL2 or the adjustments may be scaled from those applied to RL2. The corresponding adjustments may be based on laboratory testing and/or simulation data. Alternatively, similar algorithms as described herein for RL2 may be adapted to be used to adjust RL1 and RL3.

Figure 3:
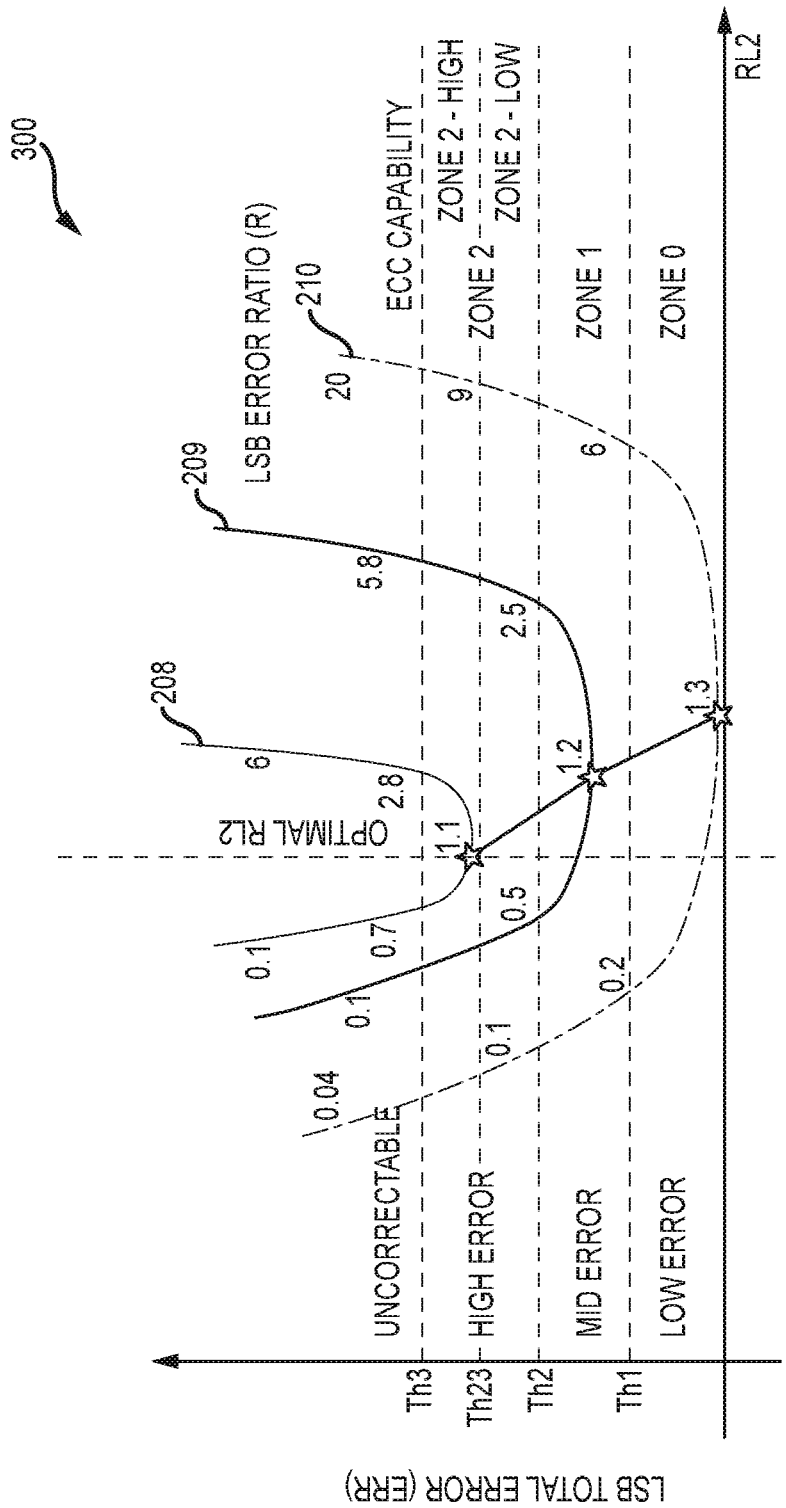
FIG. 3 depicts an example graph showing the relationship among the total LSB read errors and read level voltage according to aspects of the subject technology.

FIG. 3 depicts a version of graph 207 from FIG. 2 with a number of zones defined based on threshold values of total LSB read errors. Graph 300 shows four error threshold values: Th1, Th2, Th23 and Th3. Zone 0 corresponds to a region where the total LSB read errors are less than or equal to Th1. According to aspects of the subject technology, the number of read errors within Zone 0 is considered to be low enough that no adjustment to the read level voltage may be performed to reduce overhead operations within the data storage system.

Zone 1 corresponds to a region where the total LSB read errors are greater than Th1 and less than or equal to Th2. According to aspects of the subject technology, when the total LSB read errors fall within Zone 1, the read level voltage is adjusted using the algorithms described herein. The adjustment may be made for this zone to improve decoder efficiency and/or to provide margins to an uncorrectable level of read errors based on ECC capabilities.

Zone 2 corresponds to a region where the total LSB read errors are greater than Th2 and less than or equal to Th3. According to aspects of the subject technology, when the total LSB read errors fall with Zone 2, the read level voltage is calibrated according to algorithms described herein. In addition, a range of the LSB error ratios used in the algorithms described herein may be adjusted as well. As shown in FIG. 3, Zone 2 is divided into two subzones: Zone 2—high and Zone 2—low. Zone 2—low corresponds to the region where the total LSB read errors are greater than Th2 and less than or equal to Th23. Zone 2—high corresponds to the region where the total LSB read errors are greater than Th23 and less than or equal to Th3. When the total LSB read errors fall within Zone 2—high, the error count is approaching the threshold of the ECC capabilities in the data storage system. Accordingly, additional steps may be taken to preserve the data in the blocks being read. For example, if a dwell time of data stored in the block satisfies a threshold value, the block may be designated for a garbage collection operation. If the dwell time is below the threshold value the stored data, a variable code rate used for the data stored in the block may be evaluated if the system is configured for and uses variable code rates. For example, if the variable code rate is not already at the lowest value, the code rate for the block may be changed. If the variable code rate for the block is already at the lowest level, data stored in the block may be moved and the block retired. The threshold values of total LSB read errors are not limited to any particular values and may be set based on laboratory and/or simulation data.

Figure 4:
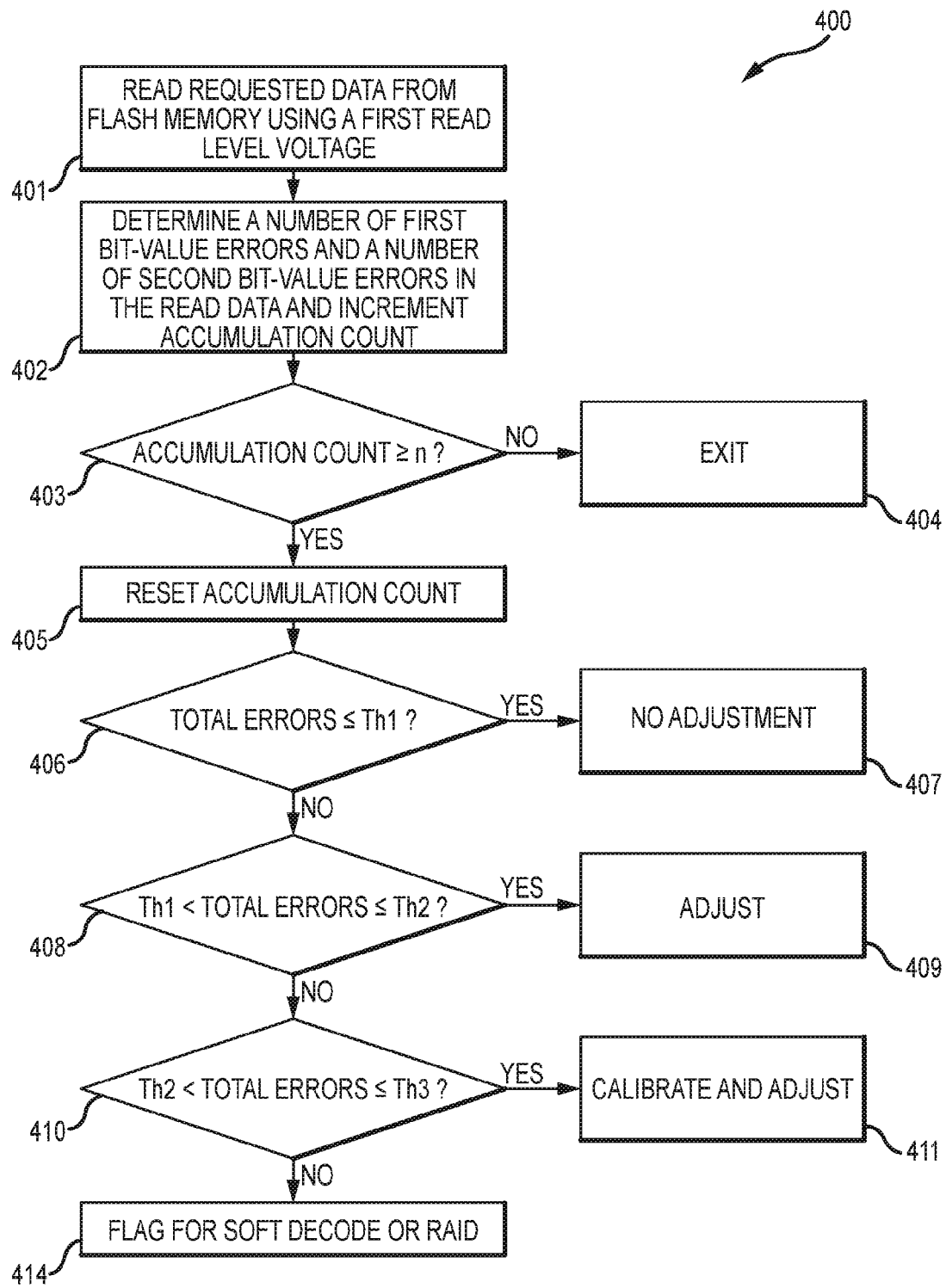
FIG. 4 depicts a flow diagram of an example process for managing a data storage system according to aspects of the subject technology.

FIG. 4 depicts a flow diagram of an example process 400 for managing read level voltages used in data storage system 100. For explanatory purposes, the various blocks of example process 400 are described herein with reference to the components and/or processes described herein. The one or more of the blocks of process 400 may be implemented, for example, by one or more processors, including, for example, controller 105 of FIG. 1 or one or more components or processors of controller 105. In some implementations, one or more of the blocks may be implemented apart from other blocks, and by one or more different processors or controllers. Further for explanatory purposes, the blocks of example process 100 are described as occurring in serial, or linearly. However, multiple blocks of example process 100 may occur in parallel. In addition, the blocks of example process 400 need not be performed in the order shown and/or one or more of the blocks of example process 100 need not be performed.

Controller 105 may maintain metadata associated with respective blocks of flash memory used to determine whether to initiate the example process 400, and to determine whether to adjust or calibrate a read level voltage. Table 4, below, provides examples of the block metadata.

TABLE 4

| Scope | Name | Size [bits] | Description |
| --- | --- | --- | --- |
| BlkSet | Flags | 4 | Block Open; $1^{st}$ Read on Closed Block, $1^{st}$ Read in Zone 2; Flagged for Ratio Change |
| Blk | Accumulation Count | 3 | Number of CW read When ≥target value, statistics are used to compute BER and Ratio metrics |
| Blk | $RL2_{Offset}$ | 2 | RL2 offset to be applied after programming first page Initial (0 Dwell Time) Read Level |
| Blk | $RL2_{Shift}$ | 3 | Delta RL2 to track optimal RL during dwell time. Value get reset when block is P/E cycled |
| Blk | Total Errors | 10, 10 | Cumulative Err 1 → 0, Cumulative Err 0 → 1 |
| Blk | Error Ratio | 4 | LSB error ratio computed from statistics |
| BlkSet | Dwell Age | 12 | Block Age (Time-Temperature) stamp of first page |

Table 4 shows the scope, name, size, and description of different metadata that may be included as part of the block metadata. Scope may indicate the unit of memory that the metadata applies to. For example, Blk indicates that the scope of the metadata is a single block and BlkSet indicates that the scope of the metadata is a stripe of blocks programmed at the same time (e.g., redundant array of independent disks (RAID) stripe).

As shown in table 4, the block metadata may contain flags associated with Block Open, $1^{st}$ Read on Closed Blocks, $1^{st}$ Read in Zone 2, and Flagged for Ratio change, which may be utilized in various steps of process 400. Block Open Flag may indicate whether a block is open or not. The block is considered to be open when the controller 105 has not written data into the last page of the block. A block may be closed when all pages within the block have been written to or, in some aspects of the subject technology, a block may be closed after a period of time has elapsed since the first or the last page was written to in the block even if pages in the block remain unused for data storage.

The block metadata may include a flag associated with $1^{st}$ Read on Closed Block. The $1^{st}$ Read on Closed Block flag may indicate whether a block is being read for the first time after the block has been closed. The $1^{st}$ Read in Zone 2 flag may indicate whether a block is being read for the first time since being closed with the total number of LSB errors determined to be in Zone 2. The Flagged for Ratio Change flag may indicate whether a target LSB error ratio has been flagged for adjustment based on determinations made during the processes discussed below.

The block metadata may further include $RL2_{Offset}$ and $RL2_{Shift}$, which are used in combination with $RL2_{Start}$ to produce RL2 for read operations. $RL2_{Start}$ represents an initial read level voltage and may correspond to an optimal read level voltage at an early stage of life of a flash memory device with zero dwell time for data stored in the flash memory device. $RL2_{Start}$ may be determined from NAND characterization data, for example, and may have different values corresponding to different life stages, P/E cycles, of the blocks in the flash memory device.

$RL2_{Offset}$ may be determined using the processes discussed below and added to $RL2_{Start}$ to account for block-to-block and/or die-to-die variations in the distributions of programming levels in the flash memory device, for example. $RL2_{Offset}$ may be retained across P/E cycles of the respective blocks. $RL2_{Shift}$ may be determined using the processes discussed below and added to $RL2_{Start}$ and $RL2_{Offset}$ to account for changes in the distributions of programming levels in the flash memory device due to retention or dwell time of the data stored in the blocks of the flash memory device, for example. $RL2_{Shift}$ may not be added to the other two components of RL2 until after a respective block has been closed and may be reset when the respective block is erased (e.g., the end of a P/E cycle).

The controller 105 may set the Open Block Flag to indicate that a block is currently being programmed. In some aspects, the controller 105 may not start the process 400 for adjusting and calibrating the read level voltage for the block while the Open Block Flag is set. Programming a page may affect the read level voltages of pages near the programmed page, for example, due to inter-cell interference (ICI). Accordingly, the read level voltage may be adjusted when the Open Block flag has been cleared, indicating that the block is closed.

The controller 105 may clear the Open Block flag when a last page of the block is programmed. Alternatively, controller 105 may clear the Open Block Flag if the programming of the block is not completed within a predetermined time threshold, for example, three minutes, one minute, thirty seconds, etc. Programming a block may take seconds to complete. The predetermined time threshold could be determined based on NAND characterization data. The block may be closed to further programming in the current P/E cycle at the end of the time threshold.

In block 401, controller 105 may read requested data from flash memory device 115 using a first read level voltage. As mentioned previously, the first read level voltage may be RL2, which is the sum of $RL2_{Start}$ and $RL2_{Offset}$. In block 402, the controller 105 may determine a number of first bit-value errors and a number of second bit-value errors in the read data. The numbers of first and second bit-value errors may be determined and provided by an ECC module configured to correct read errors using correction codes and algorithms such as LDPC, for example. The first bit-value errors may correspond to $err_{0 \to 1}$ and second bit-value errors may correspond to $err_{1 \to 0}$. The controller 105 may increment to total errors count for the respective bit value error types in the block metadata by the determined numbers of errors. The controller 105 also may update the error ratio (e.g., LSB error ratio) stored in the block metadata based on the updated totals errors counts. The controller 105 may increment the accumulation count in the block metadata, which indicates the number of code words read from the block since the accumulation count was last reset. In block 403, the controller 105 may compare the accumulation count with a predetermined threshold value. If the accumulation count is greater than or equal to the predetermined threshold value, the controller, in block 405, resets the accumulation count and proceeds to block 406. If the accumulation count is less than the predetermined threshold, the controller may, in block 404, exit the process 400. The predetermined threshold value may be set to any number of code words (e.g., 8, 16). The more code words required to be read before proceeding in process 400, the less likely a single bad code word read will trigger the adjustment or calibration measures described herein. The number of code words required to be read may be a function (e.g., reverse proportional) of the code word length.

In block 406, the controller 105 may determine a number of total LSB read errors, which may be the sum of the number of first bit-value errors and the number of second bit-value errors. The controller 105 may compare the number of total LSB read errors with a first error threshold. If the number of total LSB read errors is less than or equal to the first error threshold (Zone 0), then the controller 105, in block 407, may not make any adjustments and exit the process. Otherwise, the controller 105 may compare the number of total LSB read errors count to a second error threshold in block 408.

If the number of total LSB read errors is less than or equal to the second error threshold (Zone 1), then the controller 105 may adjust the RL2 in block 409. The adjusting process will be described below with respect to FIG. 5.

In block 410, the controller 105 may compare the number of total LSB read errors with a third error threshold. If the number of total LSB read errors is less than or equal to a third error threshold (Zone 2), then the controller 105 may calibrate and/or adjust the RL2 in block 411. This calibration and/or adjustment process will be described below with respect to FIG. 6.

The controller 105 may determine that the number of total LSB read errors is greater than the third error threshold in block 410. Then, in block 414, the controller 105 may flag the block for soft decode or RAID recovery operations since an error count that exceeds the third error threshold may exceed the error correction capabilities of the ECC in the data storage system.

Figure 5:
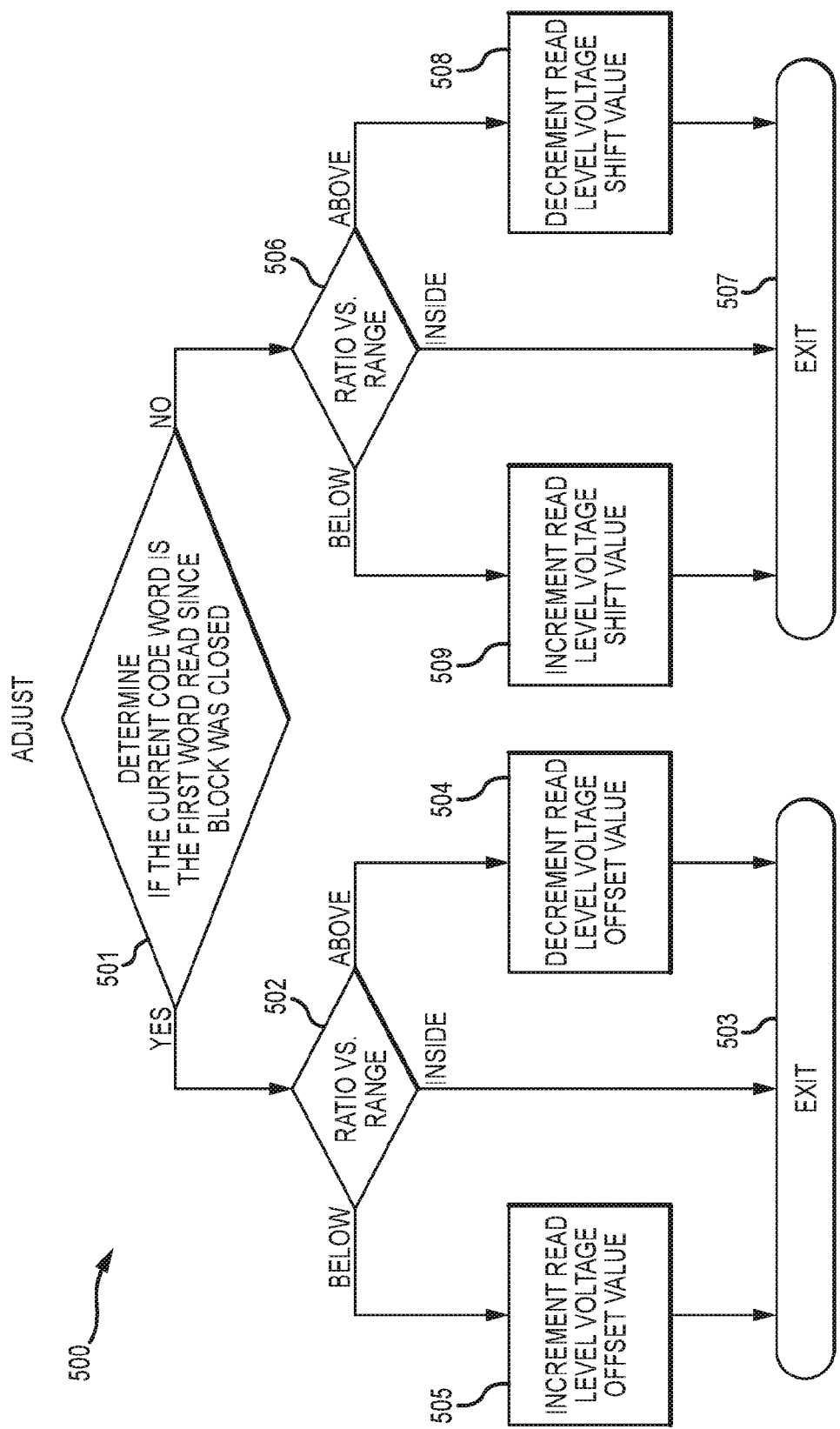
FIG. 5 depicts a flow diagram of an example process for adjusting a read voltage level according to aspects of the subject technology.

FIG. 5 depicts a flow diagram of an example process 500 for adjusting the read level voltage, which corresponds to block 409 in FIG. 4. As previously mentioned, the controller 105 may compare a number of total LSB read errors with a first error threshold and a second error threshold. If the controller 105 determines that the number of total LSB read errors is between the first error threshold and the second error threshold, then the read level voltage may be adjusted through process 500. According to some aspects, the read level voltage adjustments are done from error metrics collected from LSB central pages (25% to 75% of the address range) of closed blocks.

In block 501, the controller 105 may determine if the current code word read is the first code word read since the block was closed. For example, the controller 105 may access the $1^{st}$ Read on Closed Blocks Flag associated with the block. The $1^{st}$ Read on Closed Blocks Flag may be programmed to indicate that the block has not been read from since the block was closed. Based on the value of the $1^{st}$ Read on Closed Blocks Flag associated with the block, the controller 105 may adjust either $RL2_{offset}$ or $RL2_{Shift}$.

If the current code word read is the first code word read since the block was closed, the controller 105 may compare the LSB error ratio for the block using the block metadata to an error-ratio range in block 502. As seen in FIG. 3, LSB error ratios associated with optimal RL2s stay within a narrow range. The controller 105 may be pre-programmed with a target error-ratio and an associated error-ratio range for the flash memory device or individual blocks in the flash memory device. The target error-ratio and associated error-ratio range may be determined using characterization data, simulations, etc. and may have different values for different life cycles of the flash memory device (e.g., P/E cycle ranges). The error-ratio range may be determined by dividing the target error-ratio by a factor N, for the low end of the range, and multiplying the target error-ratio by the factor N, for the high end of the range. The factor N may initially be set to 2, for example, and adjusted at different life stages of the flash memory device. If the LSB error ratio is inside the error-ratio range, then the controller 105 may exit the process 500 in block 503 without any adjustment. Otherwise, the controller 105 may decrement the $RL2_{Offset}$ in block 504 when the LSB error ratio is above the error-ratio range and may increment the $RL2_{Offset}$ in block 505 when the LSB error ratio is below the error-ratio range.

In block 506, the controller 105 may compare the LSB error ratio for the block using the block metadata to an error-ratio range in block 506 similar to what was done in block 502. If the LSB error ratio is inside the error-ratio range, then the controller 105 may exit the process 500 in block 507 without any adjustment. Otherwise, the controller 105 may decrement the $RL2_{Shift}$ in block 508 when the LSB error ratio is above the error-ratio range and may increment the $RL2_{Shift}$ in block 509 when the LSB error ratio is below the error-ratio range.

The values of $RL2_{Shift}$ and $RL2_{Offset}$ may be incremented or decremented by changing the associated values stored in the block metadata by one bit value. For example, if two bits are used, the associated value may be incremented three times from a minimum initial value or decremented three times from a maximum value. Each bit value may correspond to a predetermined amount of voltage, such as 50 mV, 100 mV, 500 mV, etc.

Figure 6:
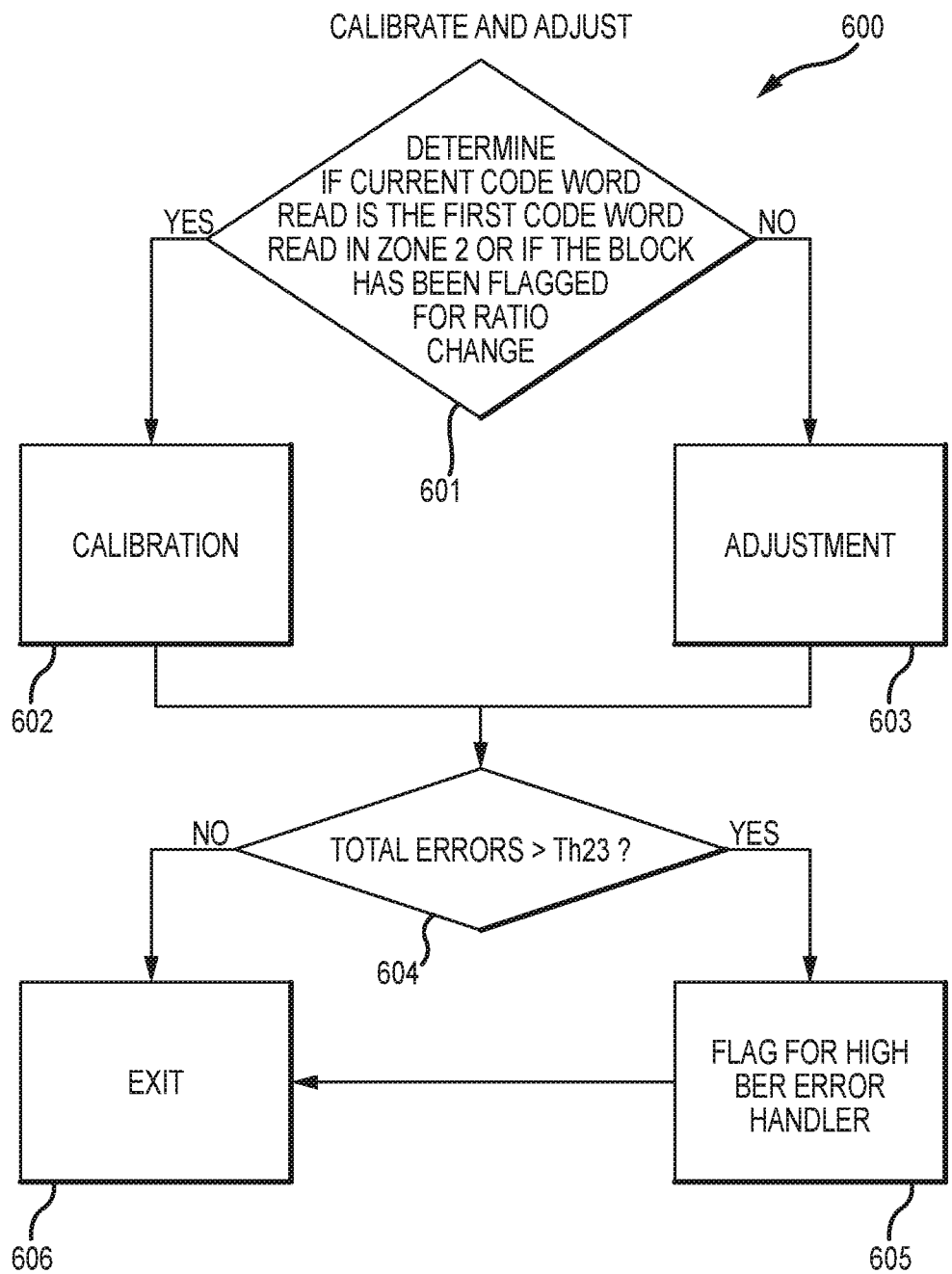
FIG. 6 depicts a flow diagram of an example process for calibrating and adjusting a read level voltage according to aspects of the subject technology.

FIG. 6 depicts a flow diagram of an example process 600 for calibrating and adjusting the read level voltage, which corresponds to block 411 in FIG. 4. In block 601, the controller 105 may determine if the current code word read is the first code word read since the block was closed with the number of total LSB errors being in Zone 2. For example, the controller 105 may access the $1^{st}$ Read in Zone 2 flag in the block metadata associated with the block. The $1^{st}$ Read in Zone 2 flag may be set after a code word has been read that results in the number of total LSB errors increasing to the level of Zone 2 discussed above. The controller 105 may also determine if the block has been flagged for ratio change by accessing the Flagged for Ratio Change flag in the block metadata associated with the block in block 601. The Flagged for Ratio Change flag may indicate that a target error-ratio should be changed and will be discussed below with respect to FIG. 8. Based on the value of the $1^{st}$ Read in Zone 2 Flag associated with the block, the controller 105 may go through a calibration loop or an optimization process.

When the current code word read is the first code word read since the block was closed with the number of total LSB errors being in Zone 2 or the block has been flagged for ratio change, the controller 105 may calibrate the read level voltage through a calibration process in block 602, which will be described below with respect to FIG. 8. If neither of these conditions is satisfied, the controller 105 may adjust the read level voltage through an adjustment process in block 603, which will be described below with respect to FIG. 7. In some embodiments, the controller 105, in block 603, may determine to go to calibration loop 602 based on, for example, the age of the block or the number of times the block has gone through optimization 603.

In block 604, the controller 105 may determine whether the sum of the number of first bit-value errors and the number of second bit-value errors (number of total LSB errors) is greater than a fourth error threshold. If the sum is less than the fourth error threshold, corresponding to Zone 2—low described above, the controller 105 may exit the process 600 in block 606. If the sum is greater than the fourth error threshold, corresponding to Zone 2—high, the controller 105 may flag the block for high BER Error Handler in block 605 before exiting the process in block 606. For example, depending on the age of the block, the BER Error Handler may designate the block for garbage collection or change the code rate used for writing data to the block. Alternatively, the block may be retired based on the age of the block (P/E cycle count) or and the lack of an available lower code rate.

Figure 7:
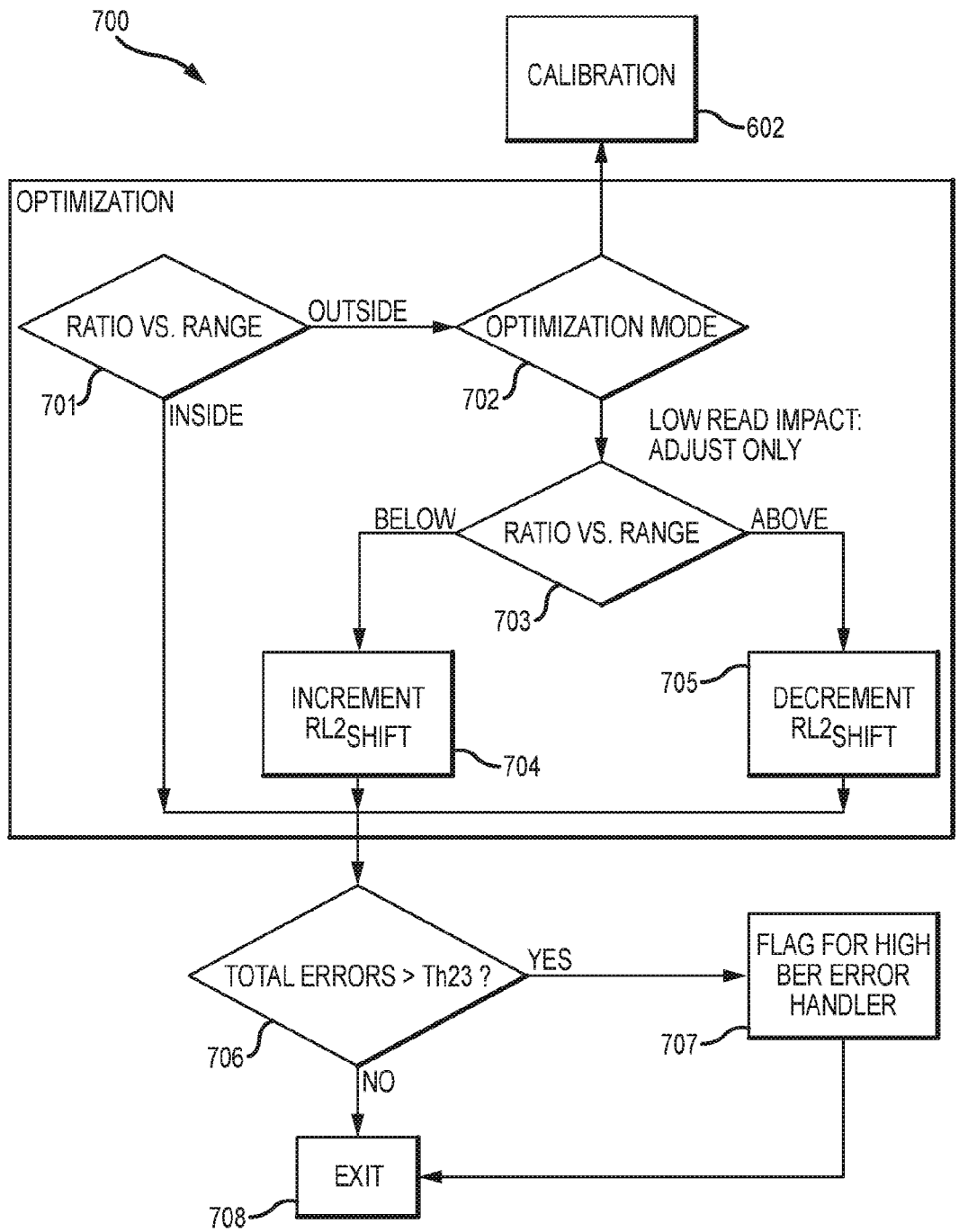
FIG. 7 depicts a flow diagram of an example process for optimizing a read level voltage according to aspects of the subject technology.

FIG. 7 depicts a flow diagram of an example process 700 for adjusting the read level voltage, which corresponds to block 603 in FIG. 6. In block 701, the controller 105 may compare an LSB error ratio to an error-ratio range. If the LSB error ratio is inside the error-ratio range, then the controller 105, in block 706, may compare the number of total LSB read errors to a fourth error threshold. According to aspects of the subject technology, the controller 105 may exit the process in block 708 if the number of total LSB read errors is less than the fourth error threshold (Zone 2—low). If the number of total LSB read errors is greater than the fourth threshold (Zone 2—high), the controller 105 may flag the block for a high BER Error Handler. Depending on an age of the block, the BER Error Handler may designate the block for garbage collection or change the code rate used for storing data in the block. For example, the controller 105 may determine the age of the block based on a number of P/E cycles associated with the block. The age of the block may be compared with one or more threshold values. If the age of the block is greater than the threshold value, then the controller 105 may initiate garbage collection. If the age of the block is less than the threshold value, then the controller 105 may change the code rate used for storing date in the block. According to aspects of the subject technology, if the age of the block is less than the threshold value and the controller 105 is unable to change the code rate (for example, because the current code rate is the lowest code rate), then the block may be designated to be retired.

If the LSB error ratio is outside the error-ratio range, then the controller 105 may check an optimization mode for the block or the flash memory device in block 702. If a low read impact mode is set, the process proceeds to block 703 to adjust the read level voltage. If the low read impact mode is not set, the process proceeds to a calibration process corresponding to block 602 in FIG. 6 and which is described below with respect to FIG. 8. The optimization mode may be set based on, for example, the age of the block, a number of times the LSB error ratio was found to be outside the error-ratio range during process 700, etc. For example, the data storage system 100 may be used mainly for reading data, which would mean that the dwell time for data stored in the blocks of flash memory device 115 may be very long. As mentioned previously, distribution of programming levels of a block may change as dwell time increases and it may be desirable to do perform calibration of the read level and the LSB error ratio.

In block 703, the controller 105 may compare the LSB error ratio to the error-ratio range. $RL2_{Shift}$ may be adjusted based on the comparison of the LSB error ratio to the error-ratio range. For example, if the LSB error ratio is below the error-ratio range, then the controller 105 may increment the $RL2_{Shift}$ in block 704. If the LSB error ratio is above the error-ratio range, then the controller 105 may decrement $RL2_{Shift}$ in block 705. The process then proceeds to block 706 discussed above.

Figure 8:
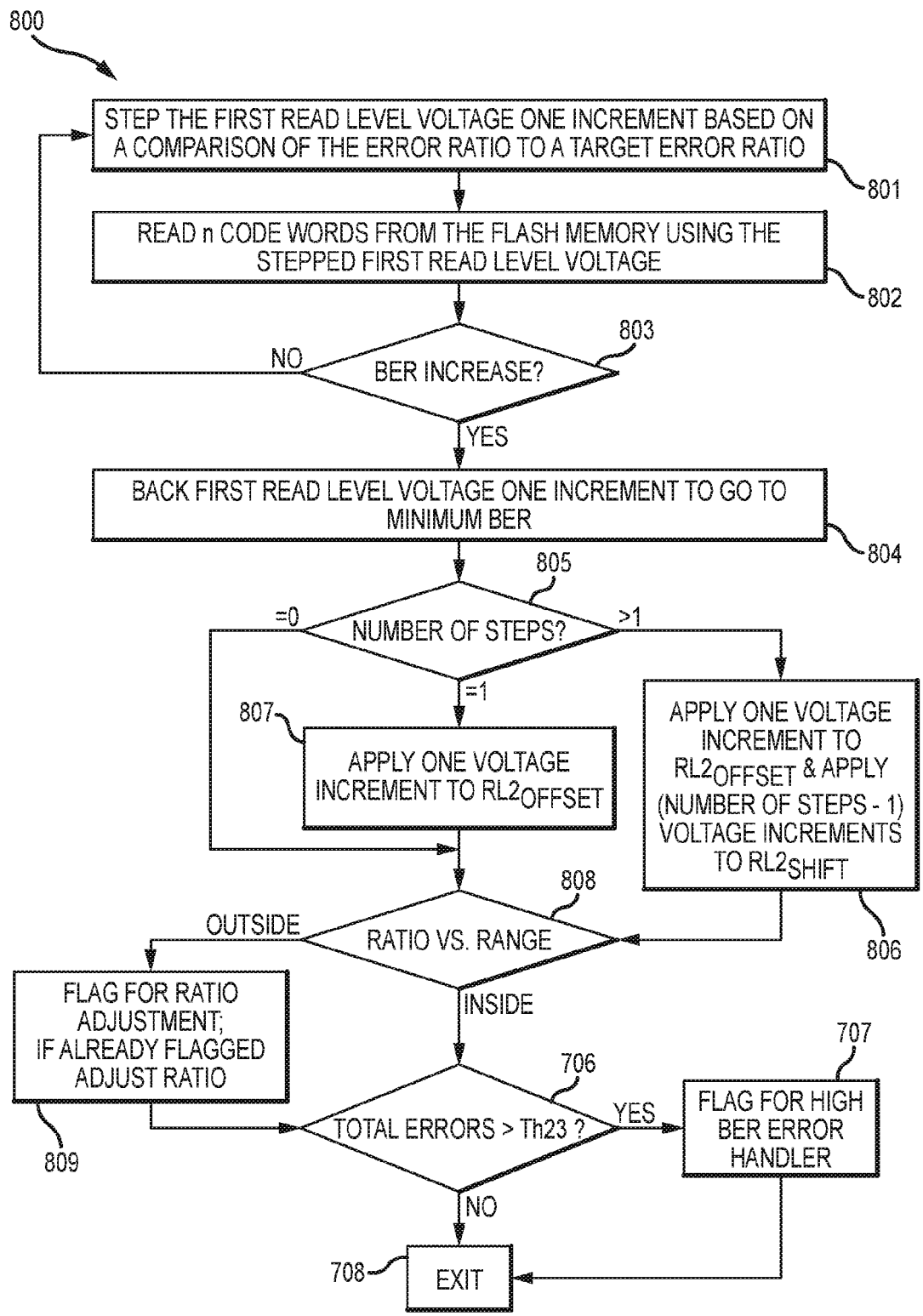
FIG. 8 depicts a flow diagram of an example process for calibrating and adjusting a read level voltage according to aspects of the subject technology.

FIG. 8 depicts a flow diagram of an example process 800 for calibrating and adjusting the read level voltage, which corresponds to block 602 in FIG. 6. In block 801, the controller 105 may step the read level voltage one increment based on a comparison of the LSB error ratio to a target error-ratio. For example, the controller 105 may decrement RL2 by one $RL_{Step}$ when the LSB error ratio is greater than a target error-ratio and may increment RL2 by one $RL_{Step}$ when the LSB error ratio is less than the target error-ratio. $RL_{Step}$ may represent a number of incremental voltage values such as 50 mV, 100 mV, 500 mV, etc. The incremental voltage values may be based on a resolution of adjusting the read level voltages available in the flash memory device 115. $RL_{Step}$ may have a sign (positive or negative) to indicate the direction in which the incremental changes were made.

In block 802, the controller 105 may read a predetermined number n code words (calibration data) from flash memory device 115 using the using the incremented or decremented RL2. The number of code words may vary in different implementations and is set to provide a sample size of read data. The controller 105 may calculate a BER based read n code words and determine if the BER has increased from a previous iteration in block 803. The controller 105 may store the calculated BER in storage medium 115 and increment a counter. The counter may indicate how many times the controller 105 has performed block 801 and block 802.

If the calculated BER has not increased, the process returns to block 801 and blocks 801, 802 and 803 are repeated. If the calculated BER has increased, the $RL_{Step}$ is backed off one incremental value in block 804, which represents the read level voltage producing a minimum BER. The value of $RL_{Step}$, which represents the number of increments the read level voltage was adjusted, is evaluated in block 805.

If the value of $RL_{Step}$ is greater than one, the controller 105 may adjust $RL2_{Offset}$ by one incremental value and adjust $RL2_{Shift}$ by a number of incremental values corresponding to the value of $RL_{Step}$ minus one in block 806 and the process proceeds to block 808. If the value of $RL_{Step}$ is equal to one, the controller 105 may adjust $RL2_{Offset}$ by one incremental value and make no adjustments to $RL2_{Shift}$ in block 807 and the process proceeds to block 808. If the value of $RL_{Step}$ is equal to zero, no adjustments are made to the read level voltage and the process proceeds to block 808. The adjustments are either incremental or decremental to correspond with the direction of the incremental changes made in block 801.

In block 808, the controller 105 may calculate a LSB error ratio based on n code words being read using the newly calculated RL2 and compare the LSB error ratio to the error-ratio range. If the LSB error ratio is within the error-ratio range, then the controller 105 may proceed to block 706, which is discussed above with respect to FIG. 7. If the LSB error ratio is outside the error-ratio range, then the controller 105 may proceed to block 809.

In block 809, the controller 105 may check the Flagged for Ratio Change flag in the block metadata. If the controller 105 determines that the Flagged for Ratio Change flag has not been previously set, then the controller 105 may set the Flagged for Ratio Change Flag and proceed to block 706. If the controller 105 determines that the Flagged for Ratio Change Flag has been previously set, then the error-ratio is adjusted before proceeding to block 706.

As described previously, the read level voltage adjustments are performed by comparing a LSB error ratio of a block with an error-ratio range and changing $RL2_{Offset}$ or $RL2_{Shift}$ associated with the block. The error-ratio range may be pre-determined, because as seen in FIG. 3, LSB error ratios associated with the optimal RL2 stay within a narrow range. However, as the number of total LSB read errors increases, the target error-ratio and its associated error-ratio range may need to be changed. For instance, if the new LSB error ratio based on the newly calculated RL2 is not in the error-ratio range, then, without adjusting the error-ratio range, the controller 105 may be adjusting the RL2 towards the wrong read level voltage, for example.

Changes to the target error-ratio may be done sparingly. According to the subject technology, the target error-ratio may not be adjusted the first time the controller 105 determines that the target error-ratio needs to be adjusted. During the first time, the controller 105 may set the Flagged for Ratio Change flag and if the controller 105 determines for a second time that the target error ratio needs to be changed, then the controller 105 adjusts the target error-ratio and its associated error-ratio range.

For example, the target ratio may be 1 and the error-ratio range may be 0.5 to 2, using a value of two for the factor N noted above. As mentioned previously, the controller 105 exits the process 500, 700 and 800 when a calculated LSB error ratio is within the error-ratio range. If the calculated LSB error ratio is outside the error-ratio range, for example, 3, the controller 105 may decrement the $RL2_{offset}$ or $RL2_{Shift}$ such that eventually the LSB error ratio becomes within 0.5 to 2. In most cases, this adjustment would lead to the controller 105 finding a RL2 close to the optimal RL2. However, if the controller 105 determines in block 808 that the LSB error ratio based on the newly calculated RL2 is outside of the error-ratio range, then the error-ratio range may need to be adjusted. This is because the new LSB error ratio is calculated based on a RL2 that yields the lowest BER, which means that the optimal RL2 is associated with an error-ratio that is not within the error-ratio range. After a first time the controller 105 does a calibration on the block, the controller may flag it, using, for example, the Flagged for Ratio Change flag. During a second time the controller 105 does a calibration on the block, the controller may change the target-error ratio and its associated error-ratio-range. In this case, the target error-ratio may be set to 3. A new error-range ratio may be determined by multiplying and dividing the new target error-ratio by the predetermined factor N. In this example, the lower bound of the range may be determined to be the target error-ratio divided by 2 (1.5) and the upper bound of the error-ratio range may be determined to be the target error-ratio multiplied by 2 (6). Blocks 706, 707 and 708 were discussed above in connection with FIG. 7 and will not be described again here.

The subject technology discussed above provides an efficient mechanism for read level adjustments and calibrations in flash memory systems. While the foregoing examples focused on MLC flash memory, the algorithms and underlying principals may be applied to other types of flash memory such as TLC or other types configured to store data using more than 3 bits, 8 levels, and therefore should not be construed to be limited to MLC flash memory.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader).

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the present disclosure or that such embodiment applies to all configurations of the present disclosure. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A method for managing a data storage system, comprising:
    reading requested data from flash memory using a first read level voltage;
    determining a number of first bit-value errors and a number of second bit-value errors in the read requested data;
    comparing an error ratio of the number of first bit-value errors and the number of second bit-value errors to an error-ratio range; and
    adjusting the first read level voltage based on the comparison of the error ratio to the error-ratio range.

2. The method of claim 1, wherein reading requested data from flash memory comprises reading and decoding a plurality of code words from a block in flash memory, and
    wherein the number of first bit-value errors and the number of second bit-value errors are determined after a target number of code words has been read and decoded.

3. The method of claim 2, further comprising determining if the block in flash memory is closed, wherein the number of first bit-value errors and the number of second bit-value errors are determined from data read after the block in flash memory is closed.

4. The method of claim 2, further comprising comparing a sum of the number of first bit-value errors and the number of second bit-value errors to a first error threshold,
    wherein the error ratio is compared to the error ratio range when the sum of the number of first bit-value errors and the number of second bit-value errors is greater than or equal to the first error threshold.

5. The method of claim 4, further comprising determining if a current code words read is the first code word read since the block was closed,
    wherein an offset value of the first read level voltage is adjusted when the code word read is the first code word read since the block was closed,
    wherein a shift value of the first read level voltage is adjusted when the code word read is not the first code word read since the block was closed, and
    wherein the offset value is maintained across program-erase cycles and the shift value is reset between program-erase cycles.

6. The method of claim 5, further comprising:
    comparing the number of first bit-value errors and the number of second bit-value errors to a second error threshold;
    determining if the current code word read is the first code word read since the block was closed; and
    calibrating the first read level voltage when the number of first bit-value errors and the number of second bit-value errors are greater than or equal to the second error threshold and the code word read is the first code words read since the block was closed.

7. The method of claim 6, wherein calibrating the first read level voltage comprises:
    stepping the first read level voltage one increment based on a comparison of the error ratio to a target ratio;
    reading calibration data from the flash memory using the stepped first read level voltage;
    repeatedly stepping the first read level voltage and reading the calibration data until a minimum error rate is produced; and
    adjusting the first read level voltage based on a number of increments the first read level voltage is stepped to produce the minimum error rate.

8. The method of claim 7, wherein the error ratio is compared to the error-ratio range and the first read level voltage is adjusted based on the comparison when the number of first bit-value errors and the number of second bit-value errors are greater than or equal to the second error threshold and the current code word read is not the first code words since the block was closed.

9. The method of claim 8, wherein adjusting the first read level voltage comprises incrementing the first read level voltage when the error ratio is below the error-ratio range, decrementing the first read level voltage when the error ratio is above the error-ratio range, and maintaining the first read level voltage when the error ratio is within the error-ratio range.

10. The method of claim 8, further comprising:
    determining a number of first bit-value errors and a number of second bit-value errors in the calibration data read using the adjusted first read level voltage;
    comparing an error ratio of the number of first bit-value errors and the number of second bit-value errors from the read calibration data to the error-ratio range; and
    adjusting the error-ratio range based on the comparison of the error ratio from the read calibration data to the error-ratio range.

11. The method of claim 10, wherein a central ratio value of the error-ratio range is adjusted to the error ratio from the read calibration data when the error ratio from the read calibration data is outside of the error-ratio range.

12. The method of claim 1, further comprising adjusting a second read level voltage and a third read level voltage based on the adjusted first read level voltage,
    wherein the flash memory is multi-level cell (MLC) flash memory, and
    wherein the first read level voltage is used to read least significant bit (LSB) data from the MLC flash memory and the second and third read level voltages are used to read most significant bit (MSB) data from the MLC flash memory.

13. A data storage system, comprising:
    flash memory; and
    a controller configured to execute a method for controlling the data storage system comprising:
        reading and decoding a plurality of code words of requested data from a block in the flash memory using a first read level voltage;
        determining a number of first bit-value errors and a number of second bit-value errors in the read requested data after a target number of code words have been read and decoded;

comparing an error ratio of the number of first bit-value errors and the number of second bit-value errors to an error-ratio range; and adjusting the first read level voltage based on the comparison of the error ratio to the error-ratio range.

14. The data storage system of claim 13, wherein the method executed by the controller further comprises comparing the number of first bit-value errors and the number of second bit-value errors to a first error threshold, wherein the error ratio is compared to the error ratio range when the number of first bit-value errors and the number of second bit-value errors are greater than or equal to the first error threshold.

15. The data storage system of claim 14, wherein the method executed by the controller further comprises determining if a current code word read is the first code words read since the block was closed, wherein an offset value of the first read level voltage is adjusted when the current code word read is the first code words read since the block was closed, wherein a shift value of the first read level voltage is adjusted when the current code word read is not the first code words read since the block was closed, and wherein the offset value is maintained across program-erase cycles and the shift value is reset between program-erase cycles.

16. The data storage system of claim 15, wherein the method executed by the controller further comprises:

comparing the number of first bit-value errors and the number of second bit-value errors to a second error threshold;

determining if the current code word read is the first code word read since the block was closed; and calibrating the first read level voltage when the number of first bit-value errors and the number of second bit-value errors are greater than or equal to the second error threshold and the current code word read is the first code words read since the block was closed.

17. The data storage system of claim 16, wherein calibrating the first read level voltage comprises:

stepping the first read level voltage one increment based on a comparison of the error ratio to a target ratio;

reading calibration data from the flash memory using the stepped first read level voltage;

repeatedly stepping the first read level voltage and reading the calibration data until a minimum error rate is produced; and adjusting the first read level voltage based on a number of increments the first read level voltage is stepped to produce the minimum error rate.

18. The data storage system of claim 17, wherein the error ratio is compared to the error-ratio range and the first read level voltage is adjusted based on the comparison when the number of first bit-value errors and the number of second bit-value errors are greater than or equal to the second error threshold and the current code word read is not the first code word read since the block was closed.

19. The data storage system of claim 18, wherein adjusting the first read level voltage comprises incrementing the first read level voltage when the error ratio is below the error-ratio range, decrementing the first read level voltage when the error ratio is above the error-ratio range, and maintaining the first read level voltage when the error ratio is within the error-ratio range.

20. The data storage system of claim 18, further comprising:

determining a number of first bit-value errors and a number of second bit-value errors in the calibration data read using the adjusted first read level voltage;

comparing an error ratio of the number of first bit-value errors and the number of second bit-value errors from the read calibration data to the error-ratio range; and adjusting the error-ratio range based on the comparison of the error ratio from the read calibration data to the error-ratio range, wherein a central ratio value of the error-ratio range is adjusted to the error ratio from the read calibration data when the error ratio from the read calibration data is outside of the error-ratio range.

* * * * *